(12) United States Patent
Hoshino et al.

(10) Patent No.: US 7,396,780 B2
(45) Date of Patent: Jul. 8, 2008

(54) METHOD FOR LASER PROCESSING OF WAFER

(75) Inventors: Hitoshi Hoshino, Tokyo (JP); Ryugo Oba, Tokyo (JP); Kenji Furuta, Tokyo (JP); Noburu Takeda, Tokyo (JP); Nobuyasu Kitahara, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 11/261,600

(22) Filed: Oct. 31, 2005

(65) Prior Publication Data

US 2006/0094260 A1 May 4, 2006

(30) Foreign Application Priority Data

Nov. 4, 2004 (JP) ............................. 2004-320067

(51) Int. Cl.
*H01L 21/324* (2006.01)
(52) U.S. Cl. .................... 438/795; 438/795; 438/33; 438/68; 257/E21.599
(58) Field of Classification Search ................ 438/795, 438/457, 463, 33, 68; 257/E21.599
See application file for complete search history.

(56) References Cited

U.S. PATENT DOCUMENTS 6,184,109 B1 * 2/2001 Sasaki et al. ................ 438/464
6,580,054 B1 * 6/2003 Liu et al. ............... 219/121.68
2004/0164061 A1   8/2004 Takeuchi et al.
2006/0035444 A1 * 2/2006 Nakamura et al. .......... 438/464

FOREIGN PATENT DOCUMENTS

JP   2003-320466   11/2003

* cited by examiner

*Primary Examiner*—David Vu
*Assistant Examiner*—Thinh T Nguyen
(74) *Attorney, Agent, or Firm*—Smith, Gambrell & Russell, LLP

(57) ABSTRACT

A method of carrying out the laser processing of a wafer with a laser beam processing machine comprising a chuck table for holding a wafer, a laser beam application means for applying a laser beam to the wafer held on the chuck table and a processing-feed means for processing-feeding the chuck table and the laser beam application means relative to each other, comprising the steps of a wafer affixing step for putting the wafer on the surface of a protective tape mounted on an annular frame, a wafer holding step for holding the wafer put on the protective tape on the chuck table, and a laser beam application step for applying a laser beam having a predetermined wavelength from the laser beam application means to the wafer held on the chuck table and processing-feeding the wafer with the processing-feed means, wherein the protective tape is made of a material which transmits the laser beam having a predetermined wavelength applied from the laser beam application means.

1 Claim, 5 Drawing Sheets

(a)

(b)

METHOD FOR LASER PROCESSING OF WAFER

FIELD OF THE INVENTION

The present invention relates to a method of carrying out a laser processing of a wafer along dividing lines formed on the wafer.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a circuit such as IC or LSI is formed in each of the sectioned areas. Individual semiconductor chips are manufactured by cutting this semiconductor wafer along the dividing lines to divide it into the areas each having a circuit formed thereon. An optical device wafer comprising gallium nitride-based compound semiconductors laminated on the front surface of a sapphire substrate is also cut along dividing lines to be divided into individual optical devices such as light emitting diodes or laser diodes, which are widely used in electric appliances.

Cutting along the dividing lines of the above semiconductor wafer or optical device wafer is generally carried out by using a cutting machine called "dicer". This cutting machine comprises a chuck table for holding a workpiece such as a semiconductor wafer or optical device wafer, a cutting means for cutting the workpiece held on the chuck table, and a cutting-feed means for moving the chuck table and the cutting means relative to each other. The cutting means comprises a rotary spindle, a cutting blade mounted on the spindle and a drive mechanism for rotary-driving the rotary spindle. The cutting blade is composed of a disk-like base and an annular cutting-edge that is mounted on the side wall peripheral portion of the base and formed as thick as about 20 μm by fixing diamond abrasive grains having a diameter of about 3 μm to the base by electroforming.

Since a sapphire substrate, silicon carbide substrate, etc. have high Mohs hardness, however, cutting with the above cutting blade is not always easy. Further, as the cutting blade has a thickness of about 20 μm, the dividing lines for sectioning devices must have a width of about 50 μm. Therefore, in the case of a device measuring 300 μm×300 μm, the area ratio of the streets to the device becomes 14%, thereby reducing productivity.

Further, to improve the throughput of a circuit such as IC or LSI, there has recently been implemented a semiconductor wafer comprising a low dielectric-insulating film (low-k film) made of a film of an inorganic material such as SiOF or BSG (SiOB) or a film of an organic material such as a polyimide-based, parylene-based, etc. polymer laminated on the front surface of a semiconductor substrate such as a silicon substrate. Since the low-k film consists of multiple layers (5 to 15 layers) and is extremely fragile like mica, however, it involves a problem that when the above semiconductor wafer is cut along the dividing lines with the cutting blade, the low-k film peels off and this peeling reaches the circuits to deal a fatal blow to the semiconductor chips.

To solve the above problem, a processing machine for removing a low-k film formed on the dividing lines of the semiconductor wafer by applying a pulse laser beam to the low-k film and cutting the semiconductor wafer along the dividing lines from which the low-k film has been removed is proposed and disclosed in JP-A 2003-320466.

To carry out the laser processing of the wafer such as a semiconductor wafer along the dividing lines, the wafer is held on the chuck table in a state where it is put on the surface of a protective tape mounted on an annular frame, and a laser beam is applied to the wafer held on the chuck table along the dividing lines. However, if a laser beam overruns the area of the wafer and is applied to the protective tape accidentally in the step of applying a laser beam to the wafer put on the front surface of the protective tape, such a problem will occur that as the protective tape is made of a synthetic resin such as vinyl chloride, a toxic gas such as dioxin is generated, thereby contaminating a clean room where a laser beam processing machine is installed and injuring the health of an operator. Further, there is another problem that when a laser beam is applied to the protective tape, the protective tape is molten and adheres to the chuck table, or a hole is formed in the protective tape, thereby making it difficult to carry the wafer.

SUMMARY OF THE INVENTION

It is an object of the present invention to provide a wafer laser processing method, capable of preventing the protective tape from being molten even when a laser beam overruns the area of the wafer and is applied to the protective tape accidentally in the step of applying a laser beam to the wafer put on the protective tape.

To attain the above object, according to the present invention, there is provided a method of carrying out a laser processing of a wafer with a laser beam processing machine comprising a chuck table for holding a wafer, a laser beam application means for applying a laser beam to the wafer held on the chuck table and a processing-feed means for moving the chuck table and the laser beam application means relative to each other, comprising the steps of:

a wafer affixing step for putting the wafer on the surface of a protective tape mounted on an annular frame;

a wafer holding step for holding the wafer put on the protective tape on the chuck table; and a laser beam application step for applying a laser beam having a predetermined wavelength from the laser beam application means to the wafer held on the chuck table and processing-feeding the wafer with the processing-feed means, wherein the protective tape is made of a material which transmits the laser beam having a predetermined wavelength applied from the laser beam application means.

According to the present invention, as the protective tape on which the wafer is put is made of a material that transmits the laser beam having a predetermined wavelength applied from the laser beam application means, even if the laser beam overruns the area of the wafer and is applied to the protective tape accidentally, the protective tape is not molten. Therefore, the protective tape does not adhere to the chuck table, or a hole is not formed in the protective tape. Further, as the protective tape is not molten, a toxic gas such as dioxin is not generated.

DETAILED DESCRIPTION OF THE PREFERRED EMBODIMENTS

A preferred embodiment of the wafer laser processing method of the present invention will be described in more detail hereinunder with reference to the accompanying drawings.

Figure 1:
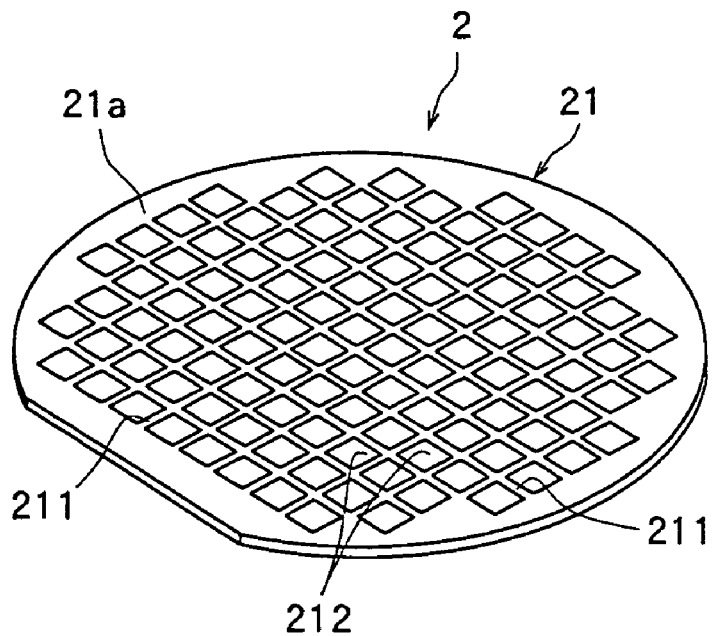
FIG. 1 is a perspective view of a semiconductor wafer as a workpiece.
Figure 2:
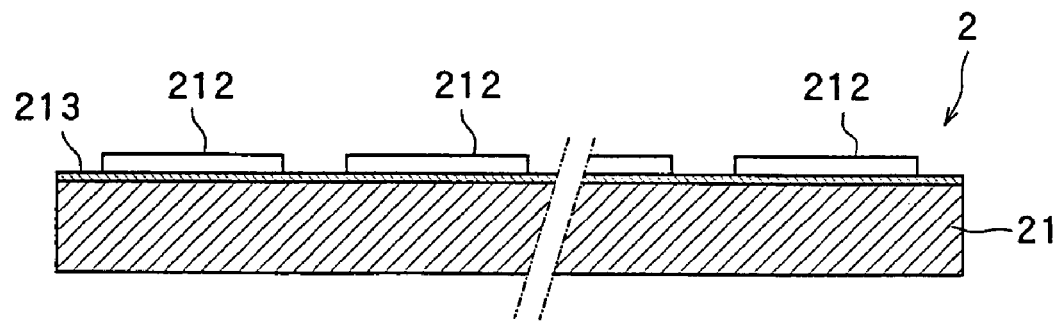
FIG. 2 is an enlarged sectional view of the semiconductor wafer shown in FIG. 1.

FIG. 1 is a perspective view of a semiconductor wafer 2 as a wafer to be laser processed, and FIG. 2 is an enlarged sectional view for dividing lines 211 of the semiconductor wafer 2 shown in FIG. 1. In the semiconductor wafer 2 shown in FIG. 1 and FIG. 2, a plurality of areas are sectioned by a plurality of dividing lines 211 arranged in a lattice pattern on the front surface 21a of a semiconductor substrate 21 composed of a silicon wafer, and a circuit 212 such as IC or LSI is formed in each of the sectioned areas. In this semiconductor wafer 2, there is formed a low dielectric-insulating film 213 laminated on the front surface 21a of the semiconductor substrate 21.

Figure 3:
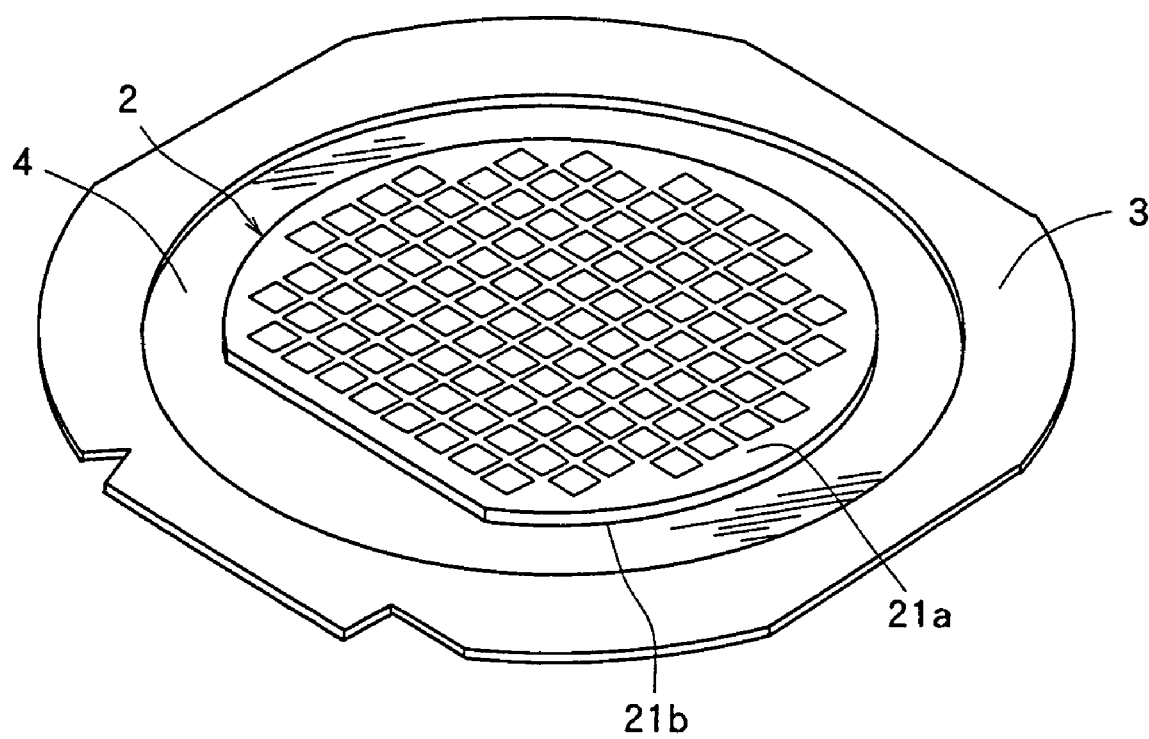
FIG. 3 is a perspective view showing a state where the semiconductor wafer shown in FIG. 1 has been put on a protective tape mounted on an annular dicing frame.

The back surface 21b side of the semiconductor wafer 2 constituted as described above is put on the surface of a protective tape 4 mounted on an annular frame 3 as shown in FIG. 3 (wafer affixing step). Therefore, the circuit 212 formed on the front surface 21a of the semiconductor wafer 2 faces up. It is important that a tape made of a material transmitting a laser beam that will be described later should be used as the above protective tape 4. For example, when the laser processing of the above semiconductor wafer 2 is carried out by using a laser beam having a wavelength of 355 nm, a tape made of a material capable of transmitting a laser beam having a wavelength of 355 nm is used as the protective tape 4. The protective tape 4 in the illustrated embodiment is a tape in which a 5 μm-thick acrylic resin adhesive layer is laid on the surface of a 100 μm-thick polyolefin-based resin sheet.

Figure 4:
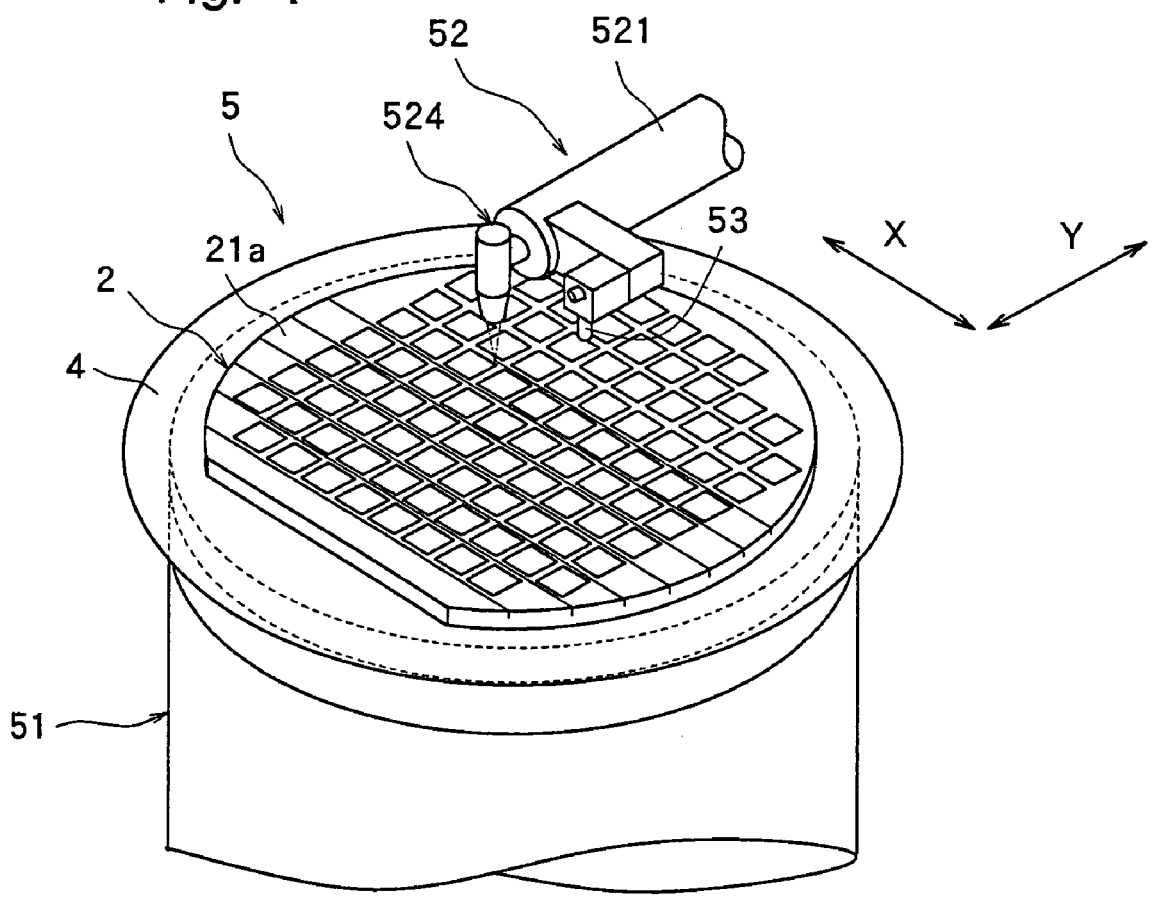
FIG. 4 is a perspective view of the principal section of a laser beam processing machine for carrying out the laser processing method of the present invention.
Figure 5:
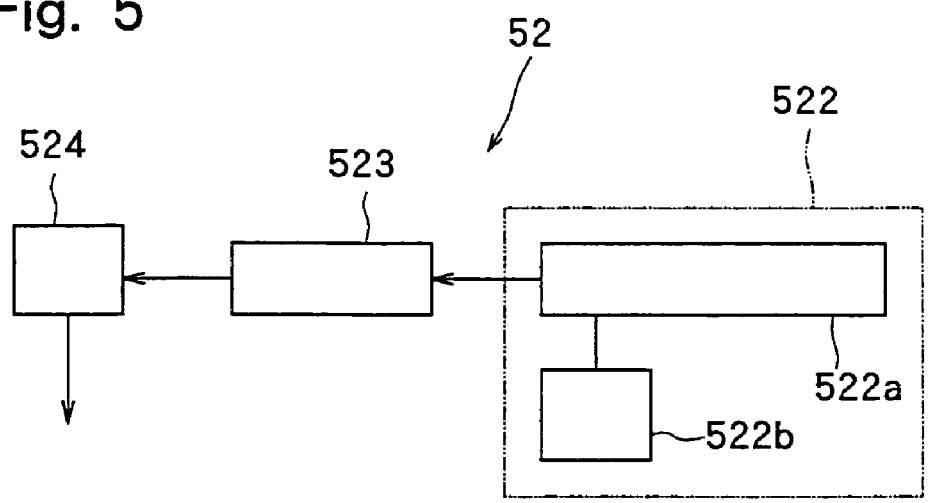
FIG. 5 is a block diagram schematically showing the constitution of a laser beam application means provided in the laser beam processing machine shown in FIG. 4.
Figure 6:
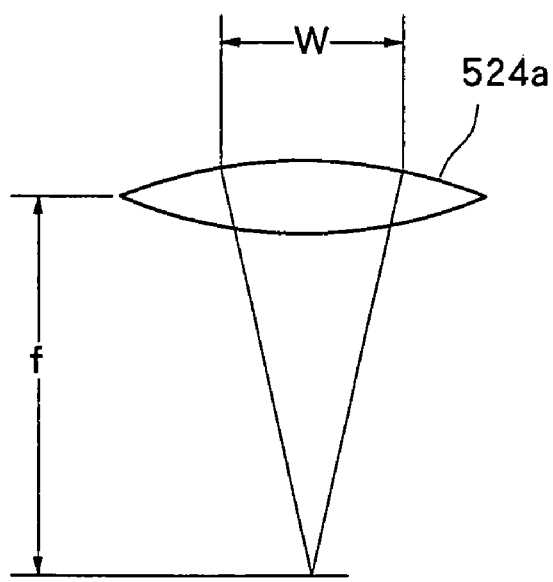
FIG. 6 is a schematic diagram for explaining the focusing spot diameter of a laser beam applied from the laser beam application means shown in FIG. 5.

To carry out laser processing for removing the low dielectric-insulating film 213 formed on the dividing lines 211 by applying a laser beam along the dividing lines 211 of the above semiconductor wafer 2, a laser beam processing machine 5 shown in FIGS. 4 to 6 is used. The laser beam processing machine 5 shown in FIGS. 4 to 6 comprises a chuck table 51 for holding a workpiece, a laser beam application means 52 for applying a laser beam to the workpiece held on the chuck table 51, and an image pick-up means 53 for picking up an image of the workpiece held on the chuck table 51. The chuck table 51 is so constituted as to suction-hold the workpiece and is designed to be moved in a processing-feed direction indicated by an arrow X in FIG. 4 by a processing-feed means (not shown) and in an indexing-feed direction indicated by an arrow Y by an indexing-feed means that is not shown.

The above laser beam application means 52 has a cylindrical casing 521 arranged substantially horizontally. In the casing 521, there are installed a pulse laser beam oscillation means 522 and a transmission optical system 523, as shown in FIG. 5. The pulse laser beam oscillation means 522 is constituted by a pulse laser beam oscillator 522a composed of a YAG laser oscillator or YVO4 laser oscillator and a repetition frequency setting means 522b connected to the pulse laser beam oscillator 522a. The transmission optical system 523 comprises suitable optical elements such as a beam splitter, etc. A condenser 524 housing condensing lenses (not shown) constituted by a combination of lenses that may be formation known per se is attached to the end of the above casing 521. A laser beam oscillated from the above pulse laser beam oscillation means 522 reaches the condenser 524 through the transmission optical system 523 and is applied to the workpiece held on the above chuck table 51 from the condenser 524 at a predetermined focusing spot diameter D. This focusing spot diameter D is defined by the expression $D\ (\mu m) = 4 \times \lambda \times f / (\pi \times W)$ (wherein $\lambda$ is the wavelength (μm) of the pulse laser beam, W is the diameter (mm) of the pulse laser beam applied to an objective lens 524a, and f is the focusing distance (mm) of the objective lens 524a) when the pulse laser beam showing a Gaussian distribution is applied through the objective lens 524a of the condenser 524, as shown in FIG. 6.

The image pick-up means 53 attached to the end of the casing 521 constituting the above laser beam application means 52 transmits an image signal to a control means that is not shown.

A description will be subsequently given of laser processing for removing the low dielectric-insulating film 213 formed on the dividing lines 211 by applying a laser beam along the dividing lines 211 of the semiconductor wafer 2 with the above laser beam processing machine 5 with reference to FIG. 4 and FIGS. 7(a) and 7(b).

The semiconductor wafer 2 put on the surface of the protective tape 4 mounted on the annular frame 3 as shown in FIG. 3 is first placed on the chuck table 51 of the laser beam processing machine 5 shown in FIG. 4 and is suction-held on the chuck table 51. Therefore, the front surface 21a of the semiconductor substrate 21 of the semiconductor wafer 2 faces up. Although the annular frame 3 mounted on the protective tape 4 is not shown in FIG. 4, it is held on a suitable frame holding means arranged on the chuck table 51.

The chuck table 51 suction-holding the semiconductor wafer 2 as described above is brought to a position right below the image pick-up means 53 by the processing-feed means that is not shown. After the chuck table 51 is positioned right below the image pick-up means 53, alignment work for detecting the area to be processed of the semiconductor wafer 2 is carried out by the image pick-up means 53 and the control means that is not shown. That is, the image pick-up means 53 and the control means (not shown) carry out image processing such as pattern matching, etc. to align a dividing line 211 formed in a predetermined direction of the semiconductor wafer 2 with the condenser 524 of the laser beam application means 52 for applying a laser beam along the dividing line 211, thereby performing the alignment of a laser beam application position. The alignment of the laser beam application position is also carried out on dividing lines 211 formed on the semiconductor wafer 2 in a direction perpendicular to the predetermined direction similarly.

Figure 7:
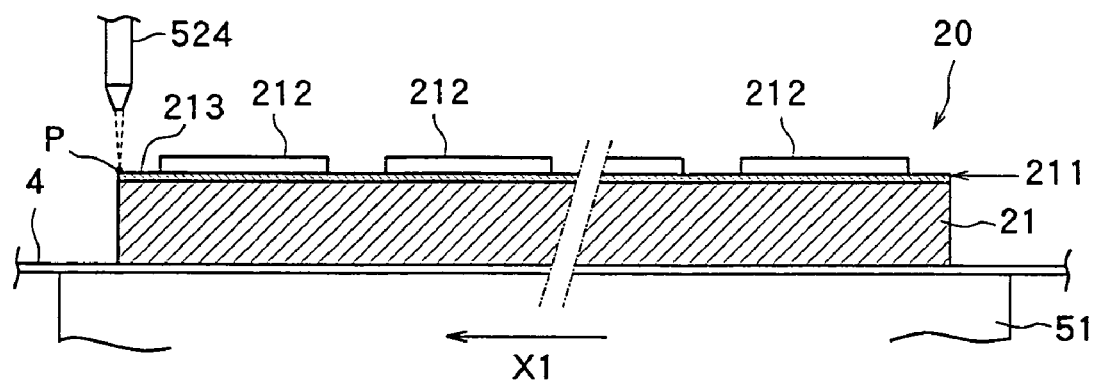
FIGS. 7(a) and 7(b) are explanatory diagrams showing the laser beam application step, which is carried out by the laser beam processing machine shown in FIG. 4.
Figure 7:
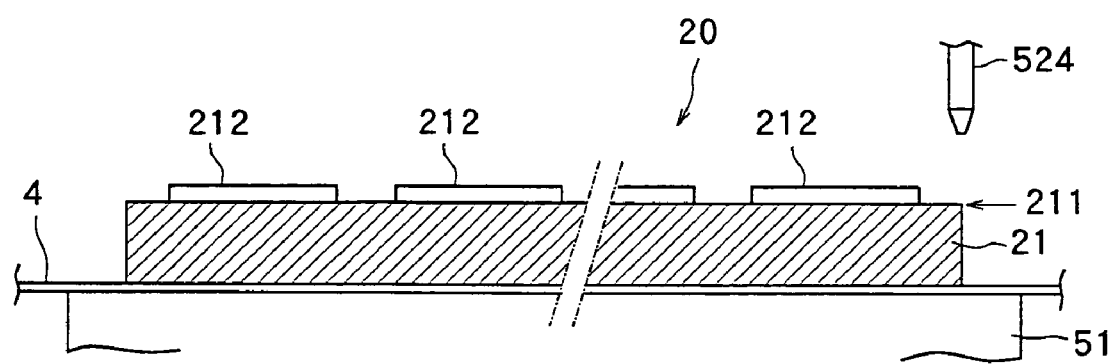

After the dividing line 211 formed on the semiconductor wafer 2 held on the chuck table 51 is detected and the alignment of the laser beam application position is carried out as described above, the chuck table 51 is moved to bring one end (left end in FIG. 7(a)) of the predetermined dividing line 211 to a position right below the condenser 524, as shown in FIG. 7(a). The chuck table 51, that is, the semiconductor wafer 2 is then moved in the direction indicated by the arrow X1 in FIG. 7(a) at a predetermined processing-feed rate while a pulse laser beam having absorbency for a silicon wafer, for example, having a wavelength of 355 nm is applied from the condenser 524. When the application position of the condenser 524 of the laser beam application means 52 reaches the other end of the dividing line 211 as shown in FIG. 7(b), the application of the pulse laser beam is suspended and the movement of the chuck table 51, that is, the semiconductor wafer 2 is stopped. As a result, the low dielectric-insulating film 213 formed on the dividing line 211 is removed as shown in FIG. 7(b) (laser beam application step). In this laser beam application step, the focusing point P of the pulse laser beam is set to a position near the front surface (top surface) of the low dielectric-insulating film 213 formed on the front surface 21a of the semiconductor substrate 21.

The processing conditions in the above laser beam application step are set as follows in the illustrated embodiment.
Light source: semiconductor excited solid-state laser (Nd:YAG)
Wavelength: 355 nm
Pulse energy: 35 µJ
Focusing spot diameter: 4 µm
Pulse width: 180 ns
Repetition frequency: 100 kHz
Processing-feed rate: 60 mm/sec In the above laser beam application step, the pulse laser beam from the condenser 524 is controlled to be applied to a distance ranging from the state where one end of the dividing line 211 formed on the semiconductor wafer 2 is positioned right below the condenser 524 to the state where the other end of the dividing line 211 is positioned right below the condenser 524. However, there is a case where the laser beam overruns both ends of the dividing line 211 of the semiconductor wafer 2. Although the laser beam is applied to the protective tape 4 at this moment, as the protective tape 4 is made of a material that transmits a laser beam having a wavelength of 355 nm applied from the condenser 524, it is not molten. Therefore, the protective tape 4 does not adhere to the chuck table 51, or a hole is not formed in the protective tape 4. Since the protective tape 4 is not molten, a toxic gas such as dioxin is not generated. As the focusing point of the laser beam passing through the protective tape 4 is set to a position near the front surface 21a (top surface) of the semiconductor wafer 2 as described above, the chuck table 51 is not damaged.

After the above laser beam application step is carried out along the predetermined dividing line 211 as described above, the chuck table 51, therefore, the semiconductor wafer 2 held on the chuck table 51 is indexing-fed by a distance corresponding to the interval between dividing lines 211 in the direction indicated by the arrow Y (indexing step) and then, the above laser beam application step is carried out similarly. After the laser beam application step and the indexing step are thus carried out on all the dividing lines 211 extending in the predetermined direction of the semiconductor wafer 2, the chuck table 51, therefore, the semiconductor wafer 2 held on the chuck table 51 is turned at 90° to carry out the laser beam application step and the indexing step on dividing lines 211 extending in a direction perpendicular to the above predetermined direction, thereby making it possible to remove the low dielectric-insulating film 213 formed on all the dividing lines 211 of the semiconductor wafer 2. After the low dielectric-insulating film 213 formed on all the dividing lines 211 of the semiconductor wafer 2 is removed, the semiconductor wafer 2 is carried to the subsequent step in a state where it is held on the annular frame 3 through the protective tape 4.

While the present invention has been described above by way of a preferred embodiment with reference to the accompanying drawings, it should be noted that the present invention is in no way limited to the above embodiment only but can be applied to various types of laser processing without departing from the scope of the present invention. In the illustrated embodiment, laser processing is carried out to remove the low dielectric-insulating film formed on the dividing lines of the semiconductor wafer. The present invention can be applied to laser processing for forming grooves (dividing grooves) along the dividing lines by applying a pulse laser beam of a wavelength (for example, 355 nm) having absorbency for a sapphire wafer along the dividing lines formed on the sapphire wafer comprising gallium nitride to divide the sapphire wafer.

What is claimed is:

1. A method of carrying out the laser processing of a wafer with a laser beam processing machine comprising a chuck table for holding a wafer, a laser beam application means for applying a laser beam to the wafer held on the chuck table and a processing-feed means for processing-feeding the chuck table and the laser beam application means relative to each other, comprising the steps of:

a wafer affixing step for putting the wafer on the surface of a protective tape mounted on an annular frame, in which a 5 µm thick acrylic resin adhesive layer is laid on the surface of a 100 µm thick polyolefin-based resin sheet;

a wafer holding step for holding the wafer put on the protective tape on the chuck table; and a laser beam application step for applying a laser beam having a wavelength of 355 nm from the laser beam application means to the wafer held on the chuck table and processing-feeding the wafer with the processing-feed means, wherein the protective tape is made of a material which transmits the laser beam having a wavelength of 355 nm applied from the laser beam application means.

* * * * *